(12) United States Patent
Manchanda et al.

(10) Patent No.: US 6,240,199 B1
(45) Date of Patent: May 29, 2001

(54) ELECTRONIC APPARATUS HAVING IMPROVED SCRATCH AND MECHANICAL RESISTANCE

(75) Inventors: Lalita Manchanda, Aberdeen, NJ (US); Edward Paul Martin, Jr., Orlando, FL (US); Gary Robert Weber, Whitehouse Station, NJ (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 08/899,735

(22) Filed: Jul. 24, 1997

(51) Int. Cl.[7] .................................. G06K 9/00; H01G 7/00
(52) U.S. Cl. ................ 382/124; 382/312; 361/283.1; 428/332; 428/450; 428/472; 428/698; 428/701; 428/702; 257/415; 257/417
(58) Field of Search ................................. 428/698, 699, 428/701, 702, 433, 432, 450, 220, 620, 641, 660; 382/124, 312; 257/415, 419, 417; 438/692; 361/271, 283.1

(56) References Cited

U.S. PATENT DOCUMENTS

| | | | |
|---|---|---|---|
| 4,353,056 | 10/1982 | Tsikos | 340/146.3 |
| 5,262,354 | 11/1993 | Cote | 437/195 |
| 5,325,442 | 6/1994 | Knapp | 382/4 |
| 5,373,181 | * 12/1994 | Scheiter et al. | 257/415 |
| 5,426,330 | 6/1995 | Joshi et al. | 257/752 |
| 5,446,616 | 8/1995 | Warren | 361/283.2 |
| 5,828,773 | * 10/1998 | Setlak et al. | 382/124 |
| 5,844,287 | * 12/1998 | Hassan et al. | 257/419 |
| 5,862,248 | * 1/1999 | Salatino et al. | 382/124 |
| 5,907,627 | * 3/1999 | Borza | 382/124 |
| 5,910,022 | * 6/1999 | Weling | 438/692 |

* cited by examiner

*Primary Examiner*—Deborah Jones
*Assistant Examiner*—Stephen Stein
(74) *Attorney, Agent, or Firm*—John M. Harman

(57) ABSTRACT

Embodiments of the invention include a sensor such as a capacitive sensor with improved scratch resistance. The sensor has a substrate and a layer of sensing elements formed thereon that are formed from materials having a greater mechanical firmness than conventional aluminum or other soft metal materials. Sensor interconnects also are made of such materials. The increased mechanical firmness of the sensing elements and interconnects improves the scratch and mechanical resistance thereof by reducing scratches, mechanical stress and cracks by reducing the deformation and consequently the bridge and/or gap effects of the sensing element material. Such effects plague conventional electronic devices, integrated circuits and sensors. Alternatively, the inventive sensor includes, e.g., a dielectric region operably coupled to the sensing elements and interconnects, thus forming a capacitive sensor or other electronic devices. The sensing elements and interconnects are formed beneath, within or on top of the dielectric region, and their improved mechanical firmness improves the scratch and mechanical resistance of the dielectric region or other material region formed thereon.

25 Claims, 2 Drawing Sheets

ELECTRONIC APPARATUS HAVING IMPROVED SCRATCH AND MECHANICAL RESISTANCE

BACKGROUND OF THE INVENTION

1. Field of the Invention

The invention relates to electronic devices including integrated circuit sensors, imagers and other sensing devices. More particularly, the invention relates to improved scratch and mechanical resistance for integrated circuit devices including integrated circuit sensors, other sensing devices and other electronic devices.

2. Description of the Related Art

Sensing devices including integrated circuit (IC) devices such as those used for capacitive sensors desire scratch resistant surfaces to protect the integrated circuit from repeated contact by external elements. For example, in capacitive sensors such as fingerprint sensors, the ridges and valleys on the finger tip making contact with the surface of the sensor (e.g., a CMOS chip) form variations in capacitance across a dielectric material in the chip that can be measured by an array of sensing elements arranged within the chip. The capacitance variations are then output by the sensor and used to form an image of the fingerprint.

Conventional sensors of this kind typically provide one or more layers including mechanically firm dielectric materials, e.g., silicon nitride ($Si_3N_4$), silicon dioxide ($SiO_2$), and aluminum oxide ($Al_2O_3$). Also, the sensing elements and interconnect wires, which typically are formed on top of, within or below the dielectric region, typically are made of aluminum, copper, chromium, alloys of these metals, or multi-layers of these metals, because of their relatively low resistivities. For example, see the capacitive sensors disclosed in U.S. Pat. No. 4,353,056, issued to Tsikos, and U.S. Pat. No. 5,325,442, issued to Knapp.

However, sensors including integrated circuit sensors having such arrangements are still susceptible to scratches from the stress of repeated touch and from sharp, pointed external elements (e.g., fingernails and writing instruments). Such scratches and mechanical stress effects degrade the performance and/or functionality of the device and often lead to the complete failure of the device. Therefore, it is desirable to provide a sensor in general and an integrated circuit sensing device in particular having an improved scratch resistance and mechanical resistance over existing devices.

SUMMARY OF THE INVENTION

The invention is embodied in a sensor such as a capacitive sensor with improved scratch resistance. The sensor has a substrate and a layer of sensing elements formed thereon that are formed from materials having a greater mechanical firmness than conventional aluminum or other soft metal materials. Sensor interconnects also are made of such materials. The increased mechanical firmness of the sensing elements and interconnects improves the scratch and mechanical resistance thereof by reducing scratches, mechanical stress and cracks by reducing the deformation and consequently the bridge and/or gap effects of the sensing element material. Such effects plague conventional electronic devices, integrated circuits and sensors. Alternatively, the inventive sensor includes, e.g., a dielectric region operably coupled to the sensing elements and interconnects, thus forming a capacitive sensor or other electronic devices. The sensing elements and interconnects are formed beneath, within or on top of the dielectric region, and their improved mechanical firmness improves the scratch and mechanical resistance of the dielectric region or other material region formed thereon.

DETAILED DESCRIPTION

Figure 1:
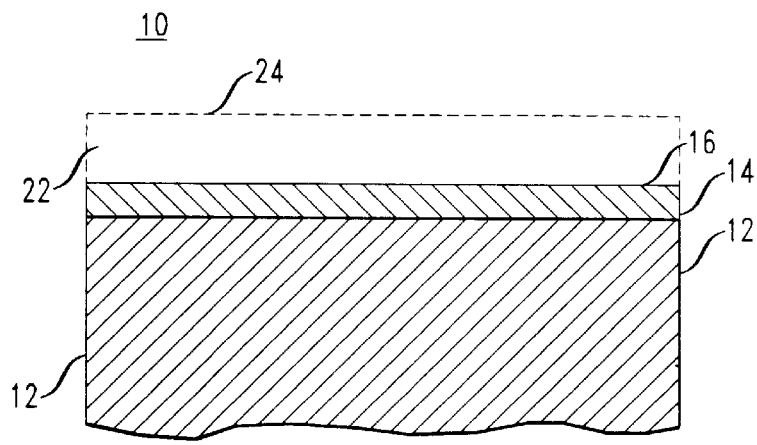
FIG. 1 is a cross-sectional view of an integrated circuit device according to an embodiment of the invention.

In the following description like reference numerals indicate like components to enhance the understanding of the invention through the description of the drawings.

Although specific features, configurations and arrangements are discussed hereinbelow, it should be understood that such is done for illustrative purposes only. A person skilled in the relevant art will recognize that other configurations and arrangements can be used without departing from the spirit and scope of the invention.

Embodiments of the invention are based on the realization that scratches, stress, and other defects inflicted upon sensors by external elements are exacerbated by the use of sensing elements and interconnects that are made of aluminum, aluminum alloys and other relatively soft materials. For example, in capacitive sensors having a dielectric region formed over the sensing elements, soft metals such as aluminum or multi-layer metal structures with aluminum are useful as sensing elements because of their relatively low resistivities. However, such soft metals often become deformed and develop bridges and/or gaps beneath the thin dielectric region and thus cause the dielectric region to act as membranes, which are easily scratched or broken by stress inflicted thereon. Also, in sensors or other electronic devices in which these soft metal interconnects and sensing elements are formed on top of other harder materials, the soft metals often form cracks and/or gaps that lead to broken or deteriorated elements and/or interconnect wires resulting from the stress inflicted thereon.

According to embodiments of the invention, a scratch resistant region having one or more layers including the sensing elements, contacts and interconnects, are made of materials having a me cal hardness much greater than that aluminum, many aluminum alloys and other soft metals. In this manner, the device exhibits greater resistance to scratches and defects, including arrangements where the scratch resistant region has formed thereon a dielectric region of one or more dielectric layers. The scratch resistant regions are made of titanium nitride (TiN), metals such as tungsten (W), tantalum (Ta), titanium (Ti) and alloys of these metals. Some materials such as TiN are called conducting ceramics or metals. For purposes of discussion herein, titanium nitride (TiN) will be referred to and treated as metal.

Referring now to FIG. 1, a sensor 10 according to an embodiment of the invention is shown. Sensor 10 includes a substrate 12 and a scratch resistant region 14 formed on substrate 12. Typically, scratch resistant region 14 is a sensing region having a sensing surface 16 for receiving the object being sensed. Scratch resistant region 14 is operably coupled to sensing circuitry (not shown), which, for example, often is contained within substrate 12.

Substrate 12 is any substrate suitable for use with scratch resistant region 14. For example, substrate 12 is a semiconductor substrate containing, e.g., sensing circuitry and other device elements, that is coupled to scratch resistant region 14 by appropriate means. Alternatively, substrate 12 is a piezoelectric substrate or an insulating material such as glass having the appropriate coupling to scratch resistant layer 14.

Scratch resistant region 14 comprises one or more conducting ceramics, metals, metal alloys and/or layers thereof that provide a suitable mechanical hardness to the sensor. For example, scratch resistant region 14 includes at least one layer or region of titanium nitride (TiN), tungsten (W), tantalum (Ta), titanium (Ti) and alloys of these metals. According to embodiments of the invention, scratch resistant region 14 has a thickness within the range, e.g., of approximately 100 to approximately 6000 angstroms (Å). Embodiments of the invention include one or more scratch resistant regions 14 having a thickness within the range, e.g., of approximately 100 to approximately 5000 Å. Typically, the thickness of scratch resistant region 14 is within the range from approximately 1000 to approximately 3000 Å.

For sensors as capacitive sensors, a dielectric region is formed on scratch resistant region 14. Accordingly, dielectric region 22 has a sensing surface 24 for receiving an object that is being sensed. In this manner, when the object to be sensed comes into contact with sensing surface 24, a capacitor is formed with the object and scratch resistant region 14 serving as upper and lower capacitor plates on either side of dielectric region 22, which is positioned therebetween. Dielectric region 22 is made of, e.g., silicon nitride ($Si_3N_4$), silicon dioxide ($SiO_2$), aluminum oxide ($Al_2O_3$), tantalum pentoxide ($Ta_2O_5$) and titanium oxide ($TiO_2$). Alternatively, one or more layers are formed on top of dielectric region 22, e.g., for prevention of impurity migration. According to embodiments of the invention, dielectric region 22 has a thickness within the range, e.g., of approximately 1000 to approximately 10,000Å.

Figure 2A:
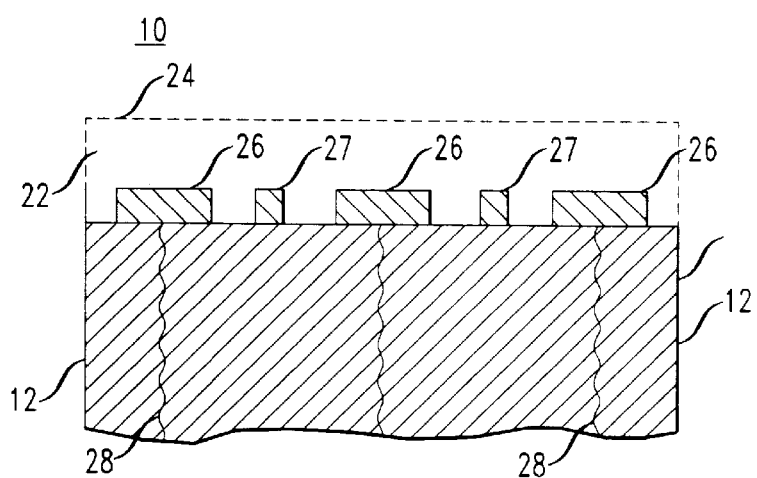
FIG. 2a is a cross-sectional view of an integrated circuit device according to an alternative embodiment of the invention.

In another embodiment of the invention, scratch resistant region 14 comprises one or more sensing elements, e.g., an array of sensing elements 26 and interconnects or interconnect wires 27 as shown in FIG. 2a. In one arrangement of this embodiment of the invention, sensing elements 26 and interconnects 27 are formed between substrate 12 and dielectric region 22, as shown, and coupled to sensing circuitry (not shown) via coupling 28. Yet, another suitable arrangement of this embodiment includes forming sensing elements 26 and interconnects 27 within dielectric region 22, as shown generally in FIG. 2b.

For scratch resistant regions within sensors such as capacitive sensors, the desired characteristics include mechanical strength, low thermal expansion coefficient, and resistance to corrosion. Conventional sensors use aluminum and aluminum alloys, e.g., as sensing elements, contacts and interconnects, typically because of the characteristic low resistivity associated with aluminum. For example, aluminum has a resistivity of approximately 1–2 $\mu$-ohm-cm. However, the mechanical hardness of aluminum is less than approximately 150 kg/$MM^2$ (Knoop hardness).

There are various methods to measure hardness and various units to quantify the hardness or mechanical strength of a material. For example, Knoop hardness is expressed in units of kg/$mm^2$. Young modulus is another measure of hardness. Young modulus is described in units of dynes/$cm^2$ or Newtons/$m^2$ or Pascals (Pa) or Gigapascals (GPa), where 1 GPa=$10^9$Pa=$10^9$ Newtons/$m^2$=$10^{10}$ dynes/$cm^2$ For purposes of discussion herein, the mechanical hardness for various materials will be expressed as the Knoop hardness of the material in bulk form. It is known that the corresponding thin film hardness is proportional, but much less than the bulk hardness of a given material.

By comparison, titanium has a mechanical hardness of approximately 200–250 kg/$mm^2$, tungsten has a mechanical hardness of approximately 400–500 kg/$mm^2$, and titanium nitride has a mechanical hardness of approximately 1500–2500 kg/$mm^2$. But, the resistivity of these materials is slightly greater than that of aluminum and many of the aluminum alloys typically used in such applications. For example, the resistivity titanium is approximately 40–50 $\mu$-ohm-cm, the resistivity of tungsten is approximately 5–10 $\mu$ohm-cm, and the resistivity of titanium nitride is approximately 60–100 $\mu$-ohm-cm.

For capacitive applications such as in fingerprint sensors, sensing elements 26 and interconnects 27 do not carry relatively large currents and therefore lower resistivities do not necessarily enhance the electrical performance. Also, in other low power electronic devices and integrated circuit applications, large currents are not being carried by sensing elements 26 and interconnects 27 and therefore appropriate circuit design changes such as increasing the widths of one or more interconnects is possible with materials according to embodiments of the invention with relatively high mechanical hardness, e.g., greater than approximately 200 kg/mm .

In conventional electronic devices including integrated circuits, materials such as titanium nitride are used over aluminum regions to prevent reflection and over and under aluminum regions to prevent migration. However, conventional devices have not contemplated using materials such as titanium nitride for purposes of scratch and mechanical resistance. Typically, the top or last level of the metal layer or layers is important for scratch and mechanical resistance. However, in conventional electronic devices, materials such as titanium nitride are used on top of or beneath the aluminum regions for various metal levels to prevent reflection and migration.

Figure 2B:
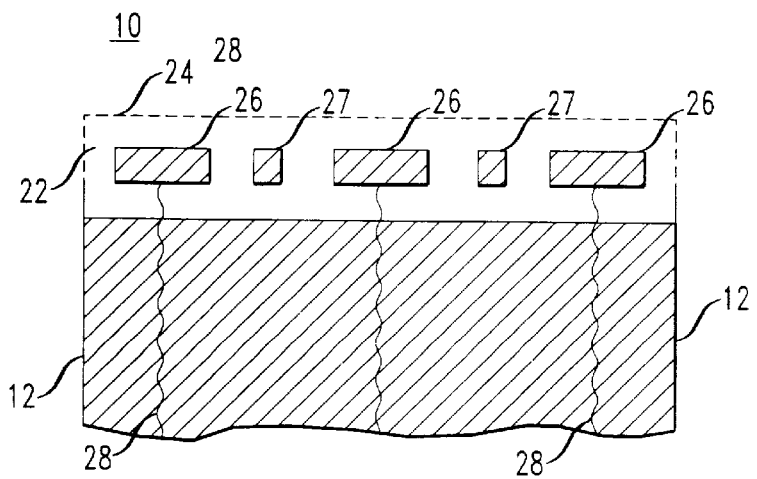
FIG. 2b is a cross-sectional view of an integrated circuit device according to an another alternative embodiment of the invention.

According to embodiments of the invention, the top or last metal layer or layers, e.g., scratch resistant region 14 as shown in FIG. 1 and sensing elements 26 and interconnects 27 as shown in FIGS. 2a–b, are not made of aluminum or aluminum alloys or other soft, low resistivity materials typically used in such applications. Rather, scratch resistant region 14 and sensing elements 26 and interconnects 27 are made of materials having a mechanical hardness much greater than that of aluminum or other conventional sensing element and interconnect materials. In this manner, devices according to embodiments of the invention enjoy a region that, both alone and with a dielectric region formed thereon, enjoys improved scratch and mechanical resistance.

Figure 3A:
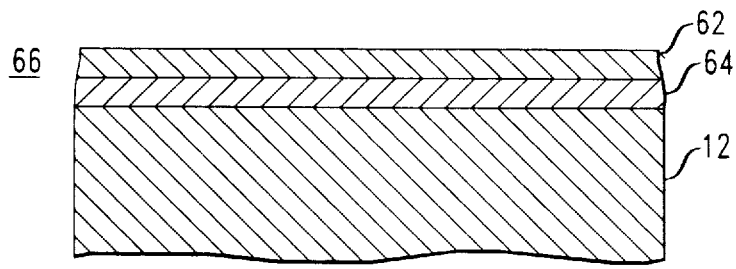
FIG. 3a is a cross-sectional view of a conventional electronc device.
Figure 3B:
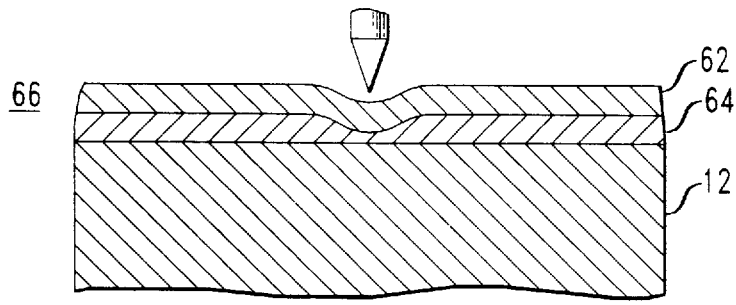
FIG. 3b is a cross-sectional view of the conventional electronic device of FIG. 3a depicting initial deformation.
Figure 3C:
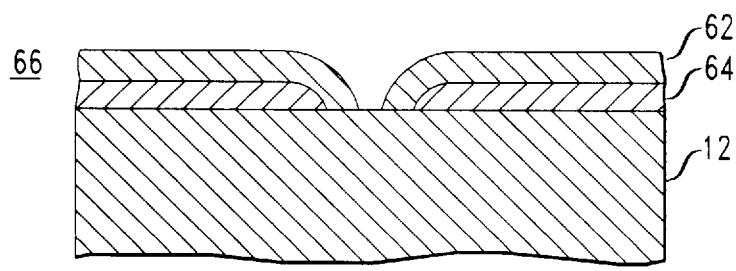
FIG. 3c is a cross-sectional view of the conventional electronic device of FIG. 3a depicting breakage of the regions.
Figure 4:
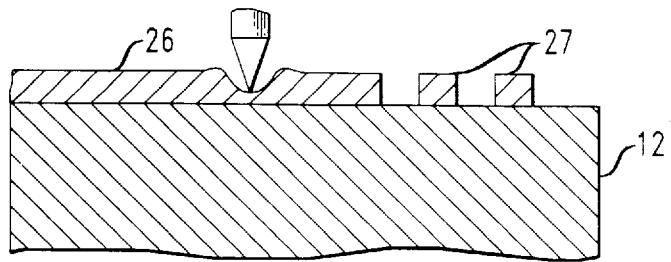
FIG. 4 is a cross-sectional view of a conventional electronic device depicting mechanical stress on soft materials caused by an external object.

As discussed earlier, scratches, stress, and other defects inflicted upon sensors by external elements are exacerbated by the use of sensing elements and interconnects that are made of aluminum, aluminum alloys and other relatively soft materials. For example, as illustrated in FIGS. 3a–c, when using a dielectric region 62 (e.g., $Al_2O_3$, or $Si_3N_4$) formed on an aluminum region 64 (e.g., in a capacitive sensor 66), local stress applied to the surface of the dielectric region tends to deform or displace the aluminum underneath, creating a gap and/or bridge (as shown generally in FIG. 3b). Scratches are caused, e.g., by fingernails (e.g., in association with a capacitive or other type of fingerprint sensor). Scratches also are caused, e.g., by the point of a writing instrument. Also, as shown in FIG. 4, in sensors and other electronic devices having top metal layers without a dielectric region thereon, external stress from, e.g., fingernails, writing instruments, or other relatively sharp objects cause undesirable displacement of sensing elements 26 and interconnects 27.

Embodiments of the invention provide improved scratch resistance by replacing the aluminum and other soft metal layers with a material that has a much greater mechanical hardness. Furthermore, according to embodiments of the invention, it has been observed that, in general, the scratch resistance of a dielectric material formed on a sensing region formed by soft materials is inversely proportional to the thickness of the sensing region. Therefore, for further improved scratch resistance, the sensing region under the dielectric material should be formed as thinly as practicable for the given application.

The materials used for scratch resistant region 14 according to embodiments of the invention, e.g., titanium nitride (TiN), metals such as tungsten (W), tantalum (Ta), titanium (Ti) and alloys of these metals, are useful with or without the additional dielectric region formed thereon. However, with respect to the use of tungsten (W) or other metals that have a relatively high level of surface roughness after deposition, the tungsten region often is used in conjunction with a subsequent polishing technique, e.g., a chemical-mechanical polishing (CMP), to reduce the surface roughness and increase the scratch resistance.

As mentioned previously herein, materials used for scratch and mechanical resistance according to embodiments of the invention also have relatively low thermal expansion coefficients. Therefore, in embodiments where sensing elements and interconnect wires exist beneath dielectric regions, such materials reduce the mismatch of thermal expansion between the sensing elements and interconnect wires and the dielectric region thereabove, thus providing high thermal and mechanical stability.

For example, a dielectric material of $Al_2O_3$ has a thermal expansion coefficient of approximately 4–6 ($\times 10^{-6}$ per degree Celsius). By comparison, the thermal expansion coefficient of aluminum is greater than 25 ($\times 10^{-6}$ per ° C.), while the thermal expansion coefficient of tungsten is less than 5 ($\times 10^{-6}$ per ° C.), Also, some hard metals, e.g. TiN, have very high corrosion resistance to chlorides such as salt (NaCl). As discussed previously herein, resistance to corrosion is a desirable characteristics of materials used in embodiments of the invention.

Furthermore, materials discussed herein for use in embodiments of the invention also are useful for applications where open ICs and sensor surfaces need to be cleaned. The cleaning may create severe scratches and mechanical stress.

Although embodiments of the invention have been described for use with capacitive, semiconductor sensors such as fingerprint sensors, embodiments of the invention are suitable for use with other kinds of sensors, e.g., pressure sensors, in which scratch resistant regions are employed with or without additional regions of dielectric materials or other materials.

Also, other applications for which embodiments of the invention are suitable for use include, e.g., smart cards, radio frequency (RF) cards, micromachines, microelectromechanical sensors (MEMs) and other open integrated circuit applications in which scratch and/or mechanical resistance is desirable. Embodiment of the invention also are useful to enhance product yields during assembly, e.g., in the packaging of integrated circuits, and the assembly of displays, 3-dimensional (3D) memory and integrated circuit stacks. Such applications include the use of non-semiconductor devices such as piezoelectric devices and/or pressure sensors.

It will be apparent to those skilled in the art that many changes and substitutions can be made to the embodiments of the scratch resistant devices herein described without departing from the spirit and scope of the invention as defined by the appended claims and their full scope of equivalents.

What is claimed is:

1. A sensor, said sensor comprising.

a substate;

a first scratch resistant region formed on said substrate, said first scratch resistant region including at least one sensing element, wherein said first scratch resistant region has a mechanical hardness greater than die mechanical hardness of aluminum and the mechanical hardness of aluminum alloys; and at least one dielectric region formed on said first scratch resistant region, said at least one dielectric region having a sensing surface, wherein the mechanical hardness of said first scratch resistant region improves the scratch resistance and resistance to deformation of the at least one dielectric region, and wherein said first scratch resistant region has a thickness within the range from approximately 100 angstroms (Å) to approximately 1000 angstroms (Å).

2. The sensor as recited in claim 1, wherein said first scratch resistant region has a mechanical hardness greater than approximately 200 $kg/mm^{22}$.

3. The sensor as recited in claim 1, wherein said first scratch resistant region has a mechanical hardness within the range from approximately 200 to approximately 5000 $kg/mm^2$.

4. The sensor as recited in claim 1, wherein said first scratch resistant region is made of one or more materials selected from the group consisting of titanium nitride (TiN), tungsten (W), tantalum (Ta), titanium (Ti), alloys of tungsten, alloys of tantalum and alloys of titanium.

5. The sensor as recited in claim 1, wherein said first scratch region is polished using chemical-mechanical polishing (CMP).

6. The sensor as recited in claim 1, wherein said sensor further comprises at least one second scratch resistant region formed on said first scratch resistant region.

7. The sensor as recited in claim 6, wherein said second scratch region is polished using chemical-mechanical polishing (CMP).

8. The sensor as recited in claim 1, wherein said first scratch region has a thermal expansion coefficient less than the thermal expansion coefficient of aluminum or the thermal expansion coefficient of aluminum alloys.

9. The sensor as recited in claim 1, further comprising at least one interconnect operably coupled to said substrate, said at least one interconnect having a mechanical hardness greater than approximately 200 kg/mm$^2$.

10. The sensor as recited in claim 1, wherein said first scratch resistant region has a resistivity less than approximately 100 micro-ohms-centimeter ($\mu$-ohms-cm).

11. The sensor as recited in claim 1, wherein said substrate includes electronic circuitry coupled to said sensing element.

12. The sensor as recited in claim 1, wherein said substrate includes a semiconductor body.

13. The sensor as recited in claim 1, wherein said substrate includes a piezoelectric body.

14. A capacitive sensor for sensing topological features of an object, said sensor comprising:
   at least one dielectric region disposed on a substrate and having a sensing surface for receiving said object; and
   at least one sensing element operably coupled to said dielectric region and capable of being coupled to electronic circuitry for measuring a capacitance formed by the sensing elements on a first side of said dielectric region and the object on a second, opposing side of said dielectric region,
   wherein said sensing element is made of at last one material having a mechanical hardness greater than approximately 200 kg/mm$^2$,
   wherein the mechanical hardness of said at least one sensing element improves the scratch resistance and deformation resistance of the at least one dielectric region, and
   wherein said sensing element has a thickness within range from approximately 100 angstroms (Å) to approximately 1000 angstroms Å).

15. The sensor as recited in claim 14, wherein said sensing element is made of one or more materials selected from the group consisting of titanium nitride (TiN), tungsten (W), tantalum (Ta), titanium (Ti), alloys of tungsten, alloys of tantalum and alloys of titanium.

16. The sensor as recited in claim 14, wherein said at least one dielectric region is made of one or more dielectric materials selected from the group consisting of silicon nitride (Si$_3$N$_4$), silicon dioxide (SiO$_2$), aluminum oxide (Al$_2$O$_3$), tantalum pentoxide (Ta$_2$O$_5$) and titanium oxide (TiO$_2$).

17. The sensor as recited in claim 14, wherein at least one of said dielectric region and said at least one sensing element has a thermal expansion coefficient less than the thermal expansion coefficient of aluminum or the thermal expansion coefficient of aluminum alloys.

18. The sensor as recited in claim 14, further comprising at least one interconnect operably coupled to at least one of said substrate and said at least one sensing element, said at least one interconnect having a mechanical hardness greater than approximately 200 kg/mm$^2$.

19. The sensor as recited in claim 14, wherein said sensing element has a resistivity less than approximately 100 micro-ohms-centimeter ($\mu$-ohms-cm).

20. A fingerprint sensing system, comprising:
   at least one dielectric region disposed on a substrate and having a sensing surface for receiving the surface of a finger; and
   at least one sensing element operably coupled to said dielectric material; and
   electronic circuitry operably coupled to said at least one sensing element for measuring the capacitance formed by the sensing elements on a first side of said dielectric material and the surface of said finger on a second, opposing side of said dielectric region,
   wherein said sensing element is made of at least one material having a mechanical hardness greater than approximately 200 kg/mm$^2$,
   wherein the mechanical hardness of said at least one sensing element improves the scratch resistance and deformation resistance of the at least one dielectric region, and
   wherein said sensing element has a thickness within the range from approximately 100 angstroms (Å) to approximately 1000 angstroms (Å).

21. The sensor as recited in claim 20, wherein said sensing element is made of one or more materials selected from the group consisting of titanium nitride (TiN), tungsten (W), tantalum (Ta), titanium (Ti), alloys of tungsten, alloys of tantalum and alloys of titanium.

22. The sensor as recited in claim 20, wherein said at least one dielectric region is made of one or more dielectric materials selected from the group consisting of silicon nitride (Si$_3$N$_4$), silicon dioxide (SiO$_2$), aluminum oxide (Al$_2$O$_3$), tantalum pentoxide (Ta$_2$O$_5$) and titanium oxide (TiO$_2$).

23. The sensor as recited in claim 20, wherein at least one of said dielectric region, and said at least one sensing element has a thermal expansion coefficient less than the thermal expansion coefficient of aluminum or the thermal expansion coefficient of aluminum alloys.

24. The sensor as recited in claim 20, further comprising at least one interconnect operably coupled to at least one of said substrate and said at least one sensing element, said at least one interconnect having a mechanical hardness greater than approximately 200 kg/mm$^2$.

25. The sensor as recited in claim 20, wherein said sensing element has a resistivity less than approximately 100 micro-ohms-centimeter ($\mu$-ohms-cm).

* * * * *